US012603658B2

(12) United States Patent (10) Patent No.: US 12,603,658 B2
Nakamura (45) Date of Patent: Apr. 14, 2026

(54) SUCCESSIVE APPROXIMATION REGISTER A/D CONVERTER

(71) Applicant: ROHM CO., LTD., Kyoto (JP)

(72) Inventor: Haruaki Nakamura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 99 days.

(21) Appl. No.: 18/591,467

(22) Filed: Feb. 29, 2024

(65) Prior Publication Data

US 2024/0322835 A1 Sep. 26, 2024

Related U.S. Application Data

(63) Continuation of application No. PCT/JP2022/032933, filed on Sep. 1, 2022.

(30) Foreign Application Priority Data

Sep. 6, 2021 (JP) ................................. 2021-145001

(51) Int. Cl.
H03M 1/10 (2006.01)
(52) U.S. Cl.
CPC ................................ H03M 1/1071 (2013.01)
(58) Field of Classification Search
CPC ......... H03M 1/10; H03M 1/1071; H03M 1/46
See application file for complete search history.

(56) References Cited

U.S. PATENT DOCUMENTS

2005/0071399 A1* 3/2005 Bonaccio ......... G01R 31/31728
708/250

2012/0032824 A1* 2/2012 Yoshioka .............. H03L 7/0814
327/155
2014/0218791 A1* 8/2014 Desbiens .............. H01S 3/1001
359/345

FOREIGN PATENT DOCUMENTS

JP 2021064873 A 4/2021

OTHER PUBLICATIONS

PCT International Search Report and International Preliminary Report on Patentability with Written Opinion of the International Searching Authority for International Application No. PCT/JP2022/032933; Date of Mailing, Nov. 29, 2022; 13 pages.

* cited by examiner

*Primary Examiner* — Omer S Khan
(74) *Attorney, Agent, or Firm* — CANTOR COLBURN LLP

(57) ABSTRACT

A capacitive array D/A converter samples an input voltage, and outputs a signal that corresponds to the input voltage IN and a threshold voltage based on control data. A comparison circuit receives an output of the capacitive D/A converter and performs comparison processing according to a comparison clock. A clock generating circuit generates a successive approximation clock. A logic circuit supplies the comparison clock to the comparison circuit based on the successive approximation clock. When a predetermined second number of cycles of the successive approximation clock are detected before a predetermined number of cycles of an external clock are detected from the start of A/D conversion, the logic circuit judges that operation is normal. Otherwise, the logic circuit judges that an abnormal state has occurred.

14 Claims, 9 Drawing Sheets

SUCCESSIVE APPROXIMATION REGISTER A/D CONVERTER

CROSS REFERENCE TO PRIOR APPLICATIONS

This application is a continuation under 35 U.S.C. § 120 of PCT/JP2022/032933, filed Sep. 1, 2022, which is incorporated herein by reference, and which claimed priority to Japanese Application No. 2021-145001, filed Sep. 6, 2021. The present application likewise claims priority under 35 U.S.C. § 119 to Japanese Application No. 2021-145001, filed Sep. 6, 2021, the entire content of which is also incorporated herein by reference.

BACKGROUND

1. Technical Field

The present disclosure relates to a successive approximation register A/D converter.

2. Description of the Related Art

As an A/D converter (ADC: Analog Digital Converter) having a medium resolution or high resolution (e.g., 8-bit resolution or higher), a successive approximation register A/D converter (SAR: Successive Approximation Register) is employed. A SARADC samples and holds an input voltage and compares the input voltage with a first threshold voltage. Subsequently, a second threshold voltage is determined according to the comparison result, and the input voltage and the threshold voltage are compared again. By repeating such an operation, an analog voltage is converted into a digital signal via a binary search.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Outline of Embodiments

Figure 1:
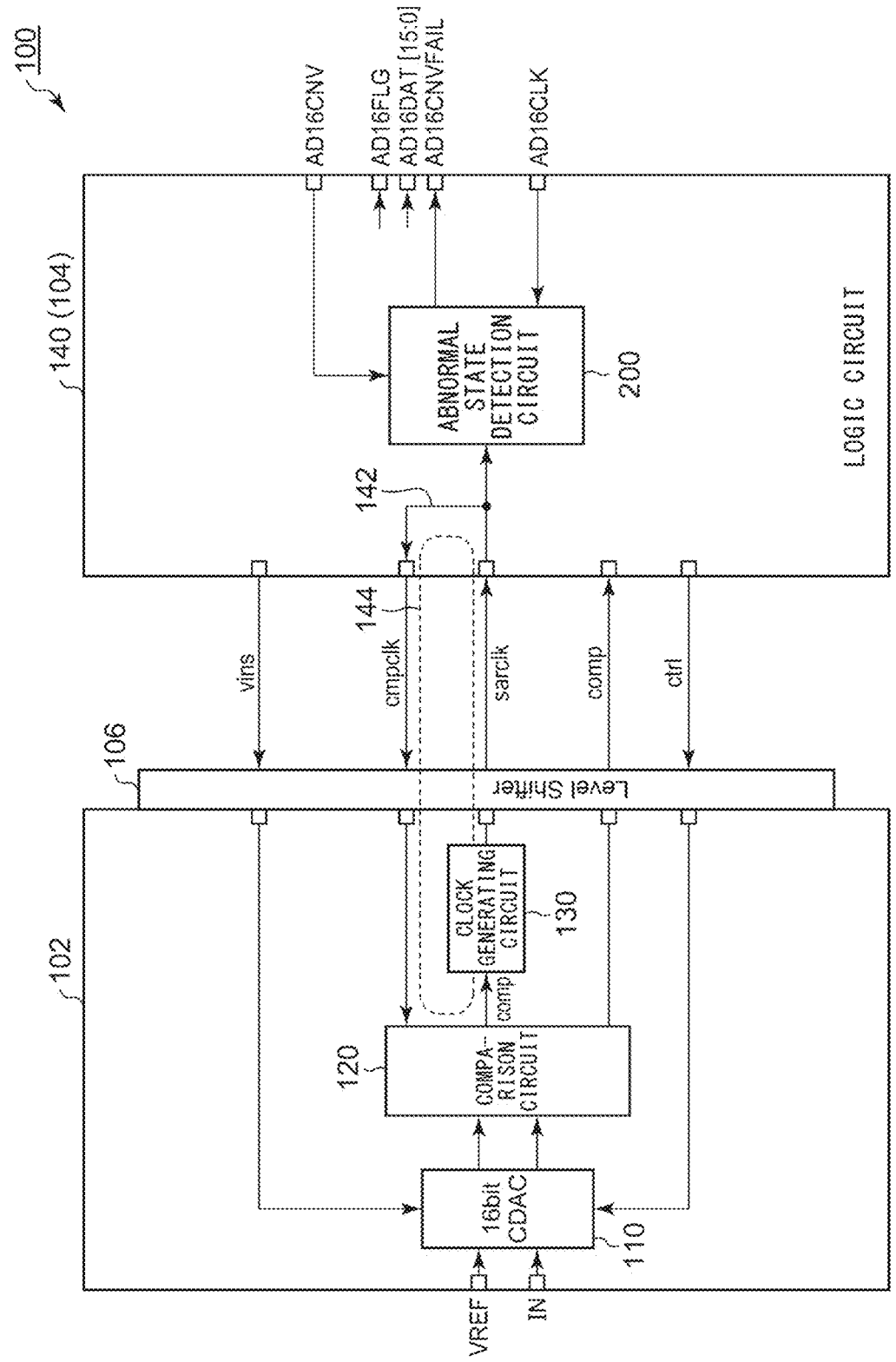
FIG. 1 is a block diagram showing a basic configuration of a SARADC according to an embodiment.

Description will be made regarding the outline of several exemplary embodiments of the present disclosure. The outline is a simplified explanation regarding several concepts of one or multiple embodiments as a preface to the detailed description described later in order to provide a basic understanding of the embodiments. That is to say, the outline described below is by no means intended to restrict the scope of the present invention and the present disclosure. Furthermore, the outline described below is by no means a comprehensive outline of all possible embodiments. That is to say, the outline is by no means intended to identify the indispensable or essential elements of all the embodiments and is by no means intended to define the scope of a part of or all the embodiments. For convenience, in some cases, an "embodiment" as used in the present specification represents a single or multiple embodiments (examples and modifications) disclosed in the present specification.

A successive approximation register A/D converter according to one embodiment includes: a capacitive array D/A converter structured to sample an input voltage, to convert control data into a threshold voltage, and to output a signal that corresponds to the input voltage and the threshold voltage; a comparison circuit structured to receive an output of the capacitive array D/A converter, and to perform comparison processing according to a comparison clock; a clock generating circuit structured to generate a successive approximation clock based on an output of the comparison circuit; and a logic circuit structured to receive a comparison signal that indicates a comparison result of the comparison circuit and the successive approximation clock, to update the control data, and to supply the comparison clock based on the successive approximation clock to the comparison circuit. The logic circuit is structured to count the successive approximation clock and an external clock after a start of A/D conversion, to judge that operation is normal when a predetermined second number of cycles of the successive approximation clock is detected before detection of a predetermined first number of cycles of the external clock, and to judge that an abnormal state has occurred when the predetermined second number of cycles of the successive approximation clock have not been detected at a time point at which the first number of cycles of the external clock have been detected.

With this configuration, a successive approximation clock and a comparison clock are transmitted between the comparison circuit and the logic circuit so as to generate a self-running clock that is asynchronous to the external clock. The successive approximation processing is supported by the successive approximation register A/D converter based on the self-running clock asynchronously with the external clock. With this, the time limit is defined using the external clock. If the A/D conversion is not completed within the time limit, judgment may be made that an abnormal state has occurred.

As viewed from the exterior, this ensures that the A/D converter determines its output data after the elapse of a predetermined first number of cycles of the external clock regardless of the frequency of an internal clock of the A/D converter.

In one embodiment, the logic circuit may include: a first circuit structured to count the external clock after an assertion of a start signal that indicates the start of A/D conversion of the A/D converter, and to assert a first timing signal in response to detection of the first number of cycles of the external clock; a second circuit structured to count the successive approximation clock after the assertion of the start signal and to assert a second timing signal in response to detection of the second number of cycles of the successive approximation clock; and a judgment circuit structured to generate a fail signal that indicates the presence or absence of an abnormal state based on the first timing signal and the second timing signal.

In one embodiment, the first circuit may include a counter structured to operate in synchronization with the external clock and to output a count value of the counter when the second timing signal is asserted. The count value can be used for optimizing parameters or debugging in the design stage. Also, during actual operation, by referring to the count value from a microcontroller that controls the A/D converter, this allows the circuit operation stability or the like to be checked.

In one embodiment, the second circuit may include an enable data generating circuit structured to generate enable data having the same number of bits as that of output data of the successive approximation register A/D converter having a bit with a value of "1" that shifts from the most significant bit to the least significant bit for each cycle of the successive approximation clock. Also, the second circuit may be structured to assert the second timing signal when the next successive approximation clock is generated in a state in which the least significant bit of the enable data is "1". With this, the second timing signal indicates a timing at which the processing ends for all the bits.

In one embodiment, the comparison circuit may include: a first delay circuit structured to delay the comparison clock; and a comparator structured to compare an output of the capacitive array D/A converter according to a latch clock delayed by the first delay circuit. With the first delay circuit, this is capable of determining the frequency of the self-running clock.

In one embodiment, the first delay circuit may be structured as a variable delay circuit. This allows the frequency of the self-running clock to be adjusted.

In one embodiment, the first delay circuit may provide a delay time that is settable from an exterior.

In one embodiment, the successive approximation register A/D converter may further include a delay time adjustment circuit structured to automatically adjust the delay time of the first delay circuit.

In one embodiment, the comparator may be structured as a differential comparator having two outputs. Also, when the latch clock is a first level, the two outputs of the comparator may become high. Also, when the latch clock is a second level, one from among the two outputs of the comparator may become low according to a comparison result. Also, the clock generating circuit may include a NAND gate structured to receive the two outputs of the comparator.

In one embodiment, the logic circuit may generate a seed pulse in synchronization with the external clock after a start of A/D conversion. Also, the seed pulse may be input to the clock generating circuit. This allows the start timing of the A/D conversion to be synchronized with the external clock.

In one embodiment, the successive approximation register A/D converter may further include a second delay circuit structured to delay an output of the clock generating circuit so as to generate the successive approximation clock. This allows the operation timing of the logic circuit to be adjusted.

In one embodiment, the successive approximation register A/D converter may be monolithically integrated on a single semiconductor substrate. Examples of such an "integrated" arrangement include: an arrangement in which all the circuit components are formed on a semiconductor substrate; and an arrangement in which principal circuit components are monolithically integrated. Also, a part of the circuit components such as resistors or capacitors may be arranged in the form of components external to such a semiconductor substrate in order to adjust the circuit constants. By integrating the circuit on a single chip, such an arrangement allows the circuit area to be reduced and allows the circuit elements to have uniform characteristics.

Embodiments

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is connected (provided) between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

FIG. 1 is a block diagram showing a basic configuration of a successive approximation register A/D converter (SARADC) 100 according to an embodiment. The SARADC 100 is monolithically integrated on a single semiconductor substrate. The SARADC 100 may be configured as a dedicated chip for an A/D converter. Also, the SARADC may be integrated in an IC (Integrated Circuit) having other functions.

First, description will be made regarding the input/output of the SARADC 100.

The SARADC 100 converts an analog input voltage input via an input terminal IN into N-bit (N represents an integer that is equal to or larger than 2) output data AD16DAT. In the present embodiment, the SARADC 100 supports N=16 bits. The output data is denoted as AD16DAT[15:0]. The input signal IN may be supplied as a single-ended signal or a differential signal.

At least one reference voltage VREF is supplied to the SARADC 100.

The SARADC 100 is supplied with an external clock (system clock) AD16CLK from an external circuit. Furthermore, a start signal AD16CNV for indicating the start of A/D conversion is input to the SARADC 100. Basically, the SARADC 100 operates in synchronization with the external clock AD16CLK. However, the successive approximation processing is performed based on a clock (which will be collectively referred to as an "internal clock") generated by an internal component of the SARADC 100. Accordingly, successive approximation processing is performed as processing substantially asynchronous to the external clock signal AD16CLK. After the assertion of the start signal AD16CNV, the SARADC 100 asserts (e.g., high level) an AD16FLAG that is generated as a flag (end signal) that indicates the determination of the output data AD16DAT [15:0].

As described later, the SARADC 100 has an abnormal state detection function. When the SARADC 100 detects an abnormal state (specifically, an A/D conversion failure), the SARADC 100 asserts (e.g., high level) the fail signal AD16CNVFAIL.

The above is the input/output of the SARADC 100. Next, description will be made regarding the configuration thereof.

The SARADC 100 includes a capacitance array D/A converter 110, a comparison circuit 120, a clock generating circuit 130, and a logic circuit 140.

The capacitive array D/A converter 110, the comparison circuit 120, and the clock generating circuit 130 are formed in an analog block 102. The logic circuit 140 is formed in a digital block 104. In a case in which there is a difference in the power supply voltage between the analog block 102 and the digital block 104, a level shifter 106 is provided between the analog block 102 and the digital block 104.

The capacitive array D/A converter 110 includes multiple capacitors and multiple switches. The capacitive array D/A converter 110 may be configured using a known technique. The capacitive array D/A converter 110 samples input voltages INP and INN using a reference voltage VREF. Furthermore, the capacitive array D/A converter 110 includes an internal component that generates a threshold voltage VTH that corresponds to control data ctrl.

A timing signal vins generated by the logic circuit 140 is input to the capacitive array D/A converter 110. The timing signal vins is a signal that is an instruction to sample the input voltage IN. During a period of the assertion (e.g., H) of the timing signal vins, the capacitive array D/A converter 110 charges its internal capacitors using the input voltage VIN so as to sample the input voltage VIN.

In the k-th (k=1, 2, . . . ) cycle of the successive conversion, the capacitive array D/A converter 110 receives control data ctrlk from the logic circuit 140. The capacitive array D/A converter 110 converts the control data ctrlk into the threshold voltage VTHK. Subsequently, the capacitive array D/A converter 110 outputs a signal that corresponds to the input voltage IN and the threshold voltage VTHk.

The comparison circuit 120 receives the output of the capacitive array D/A converter 110 and performs comparison processing according to the comparison clock cmpclk. The comparison clock cmpclk is supplied from the logic circuit 140.

The comparison circuit 120 outputs a comparison signal comp that indicates the comparison result. For example, when the input signal IN is larger than the threshold voltage VTHK, the comparison signal comp is set to the high (H) level. When the input signal IN is smaller than the threshold voltage VTHK, the comparison signal comp is set to the low (L) level.

The clock generating circuit 130 generates a successive approximation clock sarclk based on the output comp of the comparison circuit 120. The successive approximation clock sarclk is supplied to the logic circuit 140 together with the comparison signal comp.

The logic circuit 140 receives the successive approximation clock sarclk and the comparison signal that indicates the comparison result obtained by the comparison circuit 120 and updates the control data ctrl that defines the threshold voltage VTH to be used in the next successive approximation cycle. This processing is the same as that provided by a typical SARADC.

Furthermore, the logic circuit 140 generates the comparison clock cmpclk based on the successive approximation clock sarclk and supplies the comparison clock cmpclk to the comparison circuit 120. In FIG. 1, the comparison clock cmpclk and the successive approximation clock sarclk simply flow through the signal line 142. In actuality, the comparison clock cmpclk flows with a delay with respect to the successive approximation clock sarclk.

The signal line 142, the comparison circuit 120, and the clock generating circuit 130 form a delay loop 144. The clock signal is logically inverted an odd number of times during one round of passing through this delay loop 144. That is to say, the delay loop 144 can be regarded as a ring oscillator. The ring oscillator (delay loop) 144 has an oscillation frequency that corresponds to the delay time thereof. The comparison clock cmpclk and the successive approximation clock sarclk are each generated as a self-running clock that is asynchronous to the external clock AD16CLK.

The logic circuit 140 includes an abnormal state detection circuit 200. The abnormal state detection circuit 200 counts the number of cycles of the external clock AD16CLK and the number of cycles of the successive conversion clock sarclk from the start of the A/D conversion, i.e., the assertion of the start signal AD16CNV. When the abnormal state detection circuit 200 detects a predetermined second number of cycles CYC2 of the successive approximation clock sarclk before it detects a predetermined first number of cycles of the external clock AD16CLK, the abnormal state detection circuit 200 judges that the A/D conversion is normal. In this case, the abnormal state detection circuit 200 negates a fail signal AD16CNVFAIL.

Conversely, when the abnormal state detection circuit 200 has not detected the second number of cycles CYC2 of the successive approximation clock sarclk before it detects the first number of cycles CYC1 of the external clock AD16CLK from the start of the A/D conversion, the abnormal state detection circuit 200 judges that an abnormal state has occurred and asserts the fail signal AD16CNVFAIL.

The time Tend from the start of the A/D conversion to the generation of the first number of cycles CYC1 of the external clock AD16CLK is represented by Tend=CYC1× 1/fext. Here, "fext" represents the frequency of the external clock AD16CLK. Accordingly, 1/fext represents the period of the external clock AD16CLK. The time Tend represents the time limit at which the A/D conversion is to end when the SARADC 100 is normal.

If the second number of cycles CYC2 of the successive conversion clock sarclk are detected before the first number of cycles CYC1 of the external clock AD16CLK are detected, this means that conversion has been completed for all 16 bits before the time limit, and the output data AD16DAT[15:0] has been determined. That is to say, this means that the A/D conversion has completed normally.

Conversely, if the second number of cycles CYC2 of the successive conversion clock sarclk have not been detected at a time point at which the first number of cycles CYC1 of the external clock AD16CLK have been detected, this means that the conversion has not been competed for all 16 bits before the time limit. That is to say, this means that the A/D conversion has failed.

The second number of cycles CYC2 may be determined corresponding to the number of bits N (in this example, 16) of the SARADC 100. A 16-bit SARADC requires 16 successive approximation processes in order to determine all 16 bits of the output AD16DAT[15:0]. Accordingly, the A/D conversion is completed in 16 cycles of the successive approximation clock sarclk. The second number of cycles CYC2 may be determined to be equal to or larger than the number of bits N of the SARADC 100.

$$CYC2 \geq N$$

At a timing at which the second number of cycles CYC2 of the successive approximation clock sarclk are detected, the A/D conversion is complete.

In the design stage of the SARADC 100, the frequency fint of the successive conversion clock sarclk can be derived based on the design values of the circuit. Accordingly, the conversion time Tsarfin required for the A/D conversion of the SARADC 100 can be calculated as Tsarfin=CYC2×(1/fint). Here, 1/fint represents the period of the self-running clock.

The first number of cycles CYC1 can be determined based on the conversion time Tsarfin and the frequency fext of the external clock AD16CLK. For example, the first number of cycles CYC1 may be determined as follows.

$$CYC1 = Tsarfin \times fext + CYCmergin$$

Here, CYCmergin represents a margin of the number of cycles. Also, CYCmergin may be set to zero.

The above is the configuration of the SARADC 100. Next, description will be made regarding the operation thereof.

Figure 2:
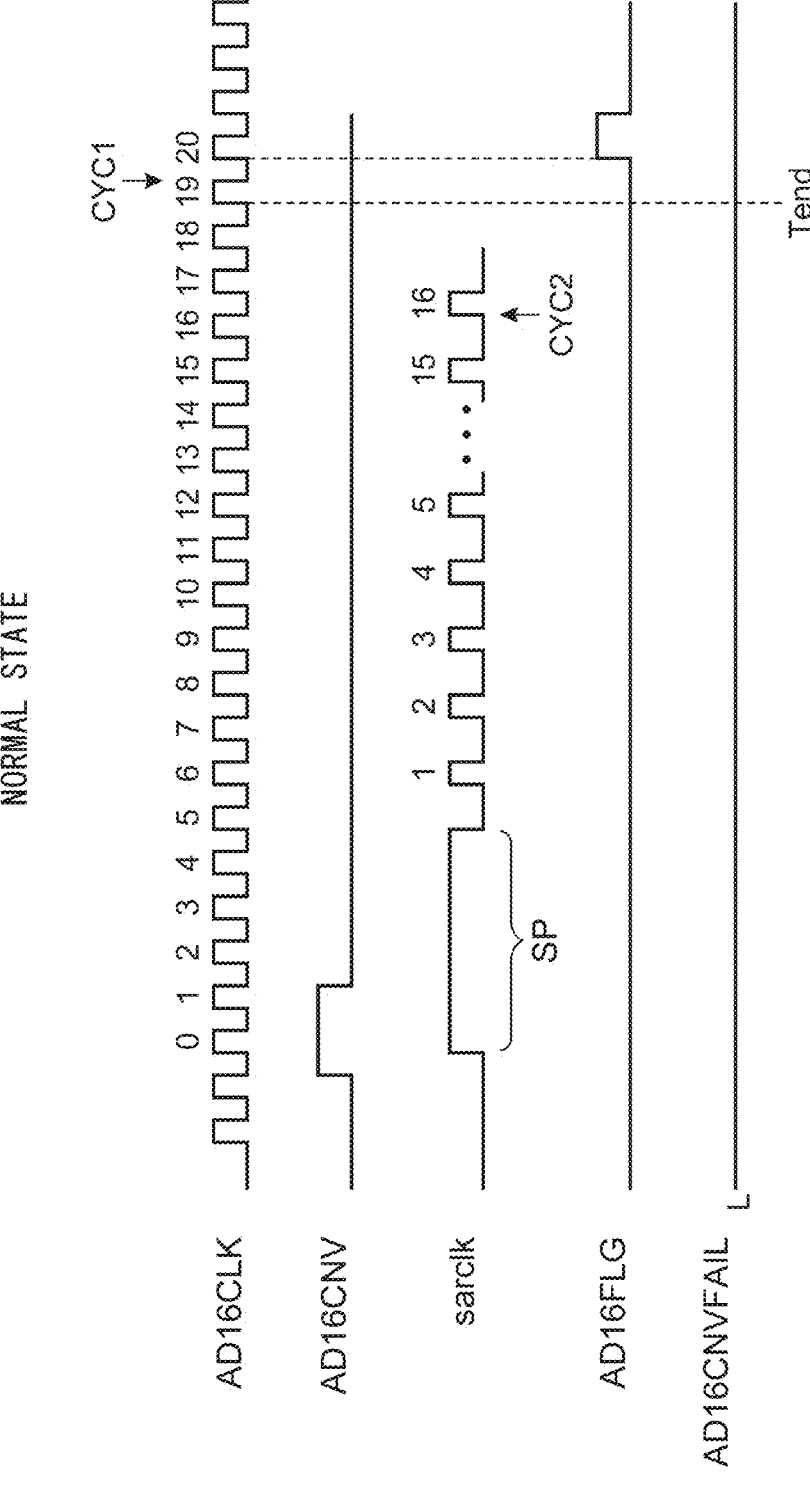
FIG. 2 is a diagram for explaining the operation of the SARADC when it is normal.

FIG. 2 is a diagram for explaining the operation of the SARADC 100 when it is normal.

Description will be made below assuming that CYC1=19 and CYC2=16.

When the start signal AD16CNV is asserted, the logic circuit 140 injects a seed pulse SP into the delay loop 144 configured as a ring oscillator. In this example, the seed pulse SP to be injected has a length of four cycles of the external clock AD16CLK. The delay loop 144 oscillates using the seed pulse SP as a seed, thereby generating the successive approximation clock sarclk.

After the assertion of the start signal AD16CNV, the logic circuit 140 counts the external clock AD16CLK. The timing at which CYC1=19 cycles is reached is employed as the time limit Tend.

The successive approximation is performed for each pulse of the successive approximation clock sarclk. The output data AD16DAT[15:0] is sequentially determined from the most significant bit (MSB) to the least significant bit. With this, when 16 cycles (=CYC2) of the successive approximation clock sarclk are detected before the time limit Tend, the abnormal state detection circuit 200 judges that the SARADC 100 is normal.

After the first number of cycles CYC1 elapse, e.g., at the 20-th cycle, which is one cycle after the first number of cycles CYC1, the logic circuit 140 asserts the end signal AD16FLG.

In this case, the SARADC 100 is normal. Accordingly, the fail signal AD16CNVFAIL is negated (L).

Figure 3:
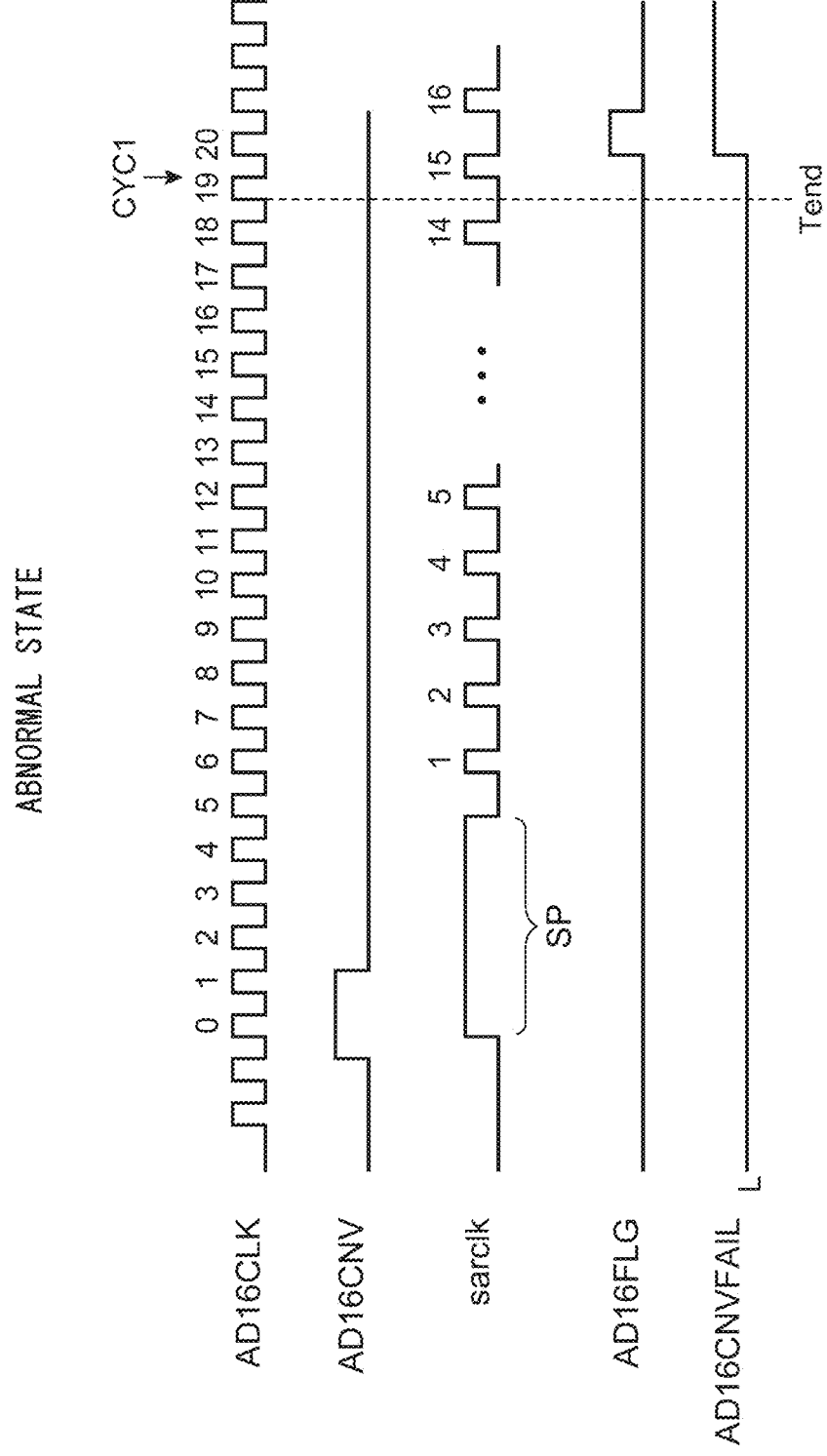
FIG. 3 is a diagram for explaining the operation of the SARADC when it is abnormal.

FIG. 3 is a diagram for explaining the operation of the SARADC 100 when it is abnormal.

After the assertion of the start signal AD16CNV, the logic circuit 140 counts the external clock AD16CLK. The timing at which CYC1=19 cycles is reached is employed as the time limit Tend.

The successive approximation is performed for each pulse of the successive approximation clock sarclk, so as to sequentially determine the output data AD16DAT[15:0] from the most significant bit (MSB) to the least significant bit.

At the time point at which the time limit Tend elapses, only 14 cycles (<CYC2) of the successive approximation clock sarclk have been detected. Accordingly, the abnormal state detection circuit 200 judges that an abnormal state has occurred.

After the first number of cycles CYC1 elapses, e.g., at the 20-th cycle, which is one cycle after the first number of cycles CYC1, the logic circuit 140 asserts the end signal AD16FLG.

In this case, an abnormal state occurs in the SARADC 100. Accordingly, the fail signal AD16CNVFAIL is asserted (H).

The above is the operation of the SARADC 100. With the SARADC 100, the successive approximation clock sarclk and the comparison clock cmpclk each pass between the comparison circuit 120 and the logic circuit 140. This generates the self-running clocks sarclk and cmpclk that are asynchronous to the external clock AD16CLK. The successive approximation processing is provided by the SARADC 100 based on the self-running clock asynchronously with the external clock AD16CLK.

In this method, the setting of the threshold voltage VTH to the comparison circuit 120 and the comparison operation of the comparison circuit 120 are performed according to the comparison clock cmpclk. The comparison clock cmpclk is generated by delaying the successive approximation clock sarclk by one cycle earlier. Accordingly, this ensures that the data (control signal ctrlk) required for the comparison circuit 120 is determined when the comparison circuit 120 operates.

Similarly, the logic circuit 140 provides digital signal processing according to the successive approximation clock sarclk. The successive approximation clock sarclk is a signal obtained by delaying the comparison clock cmpclk of the same cycle. Accordingly, this ensures that the signal (comparison signal comp) required for signal processing is determined at the time point at which the logic circuit 140 is to perform signal processing.

In a case in which the comparison circuit 120 and the logic circuit 140 are operated in synchronization with the external clock AD16CLK, when the frequency of the external clock AD16CLK deviates from its normal range, this leads to the occurrence of a timing violation, and the successive approximation processing fails. In contrast, with the present embodiment in which a self-running clock is employed, this has an advantage of being resistant to the occurrence of a timing violation even if frequency deviation occurs in the external clock AD16CLK.

As viewed from the exterior, this ensures that the SARADC 100 determines its output data AD16DAT[15:0] after the elapse of the first number of cycles CYC1 of the external clock AD16CLK regardless of the frequencies of the internal clocks sarclk and cmpclk of the SARADC 100.

Furthermore, with such an arrangement configured to detect the second number of cycles CYC2 of the successive approximation clock sarclk, this is capable of detecting whether or not the successive approximation has been completed for all the bits. With such an arrangement in which the time limit in which the A/D conversion is to be completed is defined using the external clock AD16CLK, this allows judgment to be made that an abnormal state has occurred if the A/D conversion is not completed before the time limit.

The present disclosure encompasses various kinds of apparatuses and methods that can be regarded as a block configuration or a circuit configuration shown in FIG. 1, or otherwise that can be derived from the aforementioned description. That is to say, the present disclosure is not restricted to a specific configuration. More specific description will be made below regarding example configurations and examples for clarification and ease of understanding of the present disclosure, the essence of the present disclosure, or the operation thereof. That is to say, the following description will by no means be intended to restrict the technical scope of the present disclosure.

Figure 4:
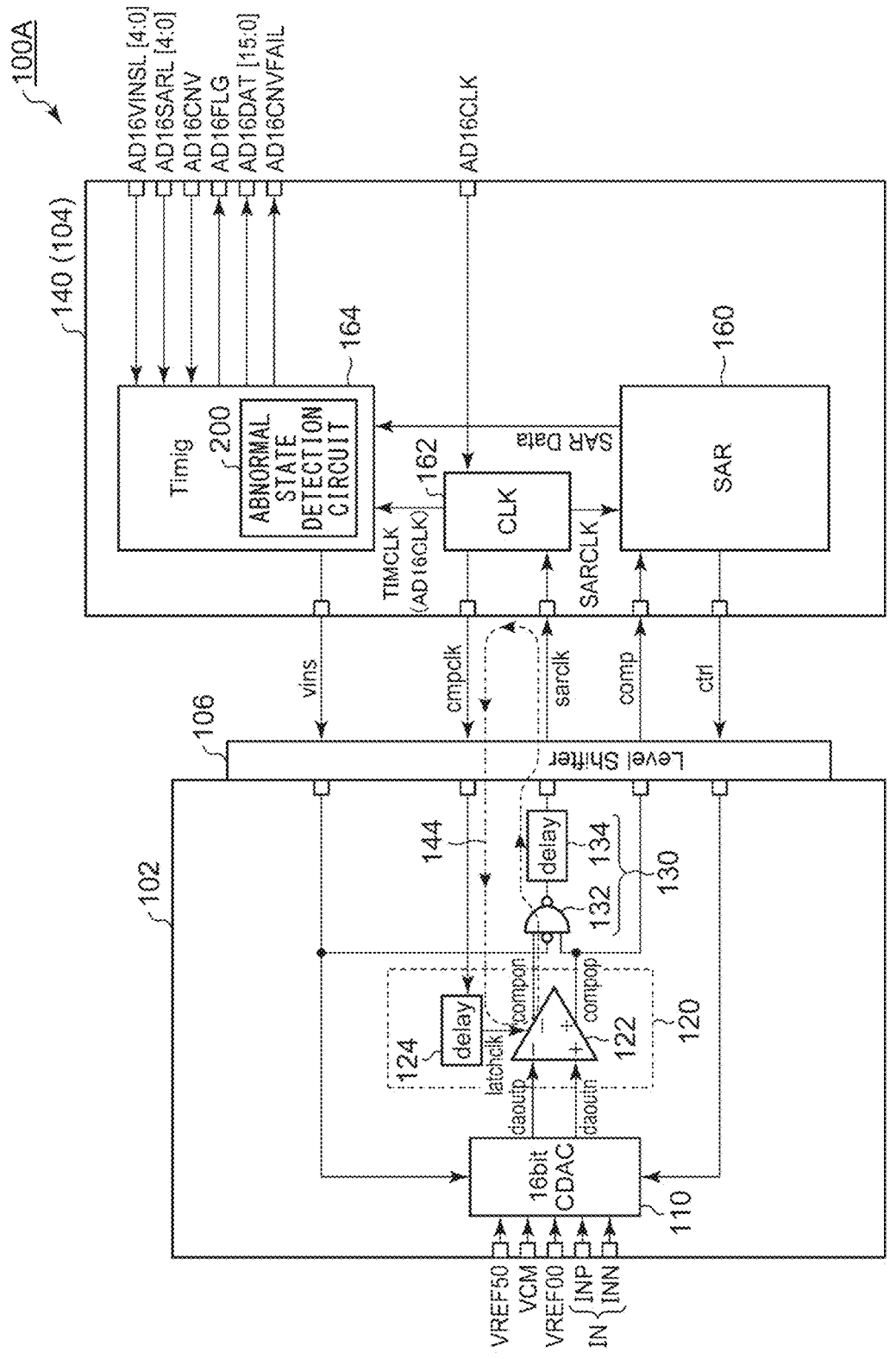
FIG. 4 is a circuit diagram showing a specific example configuration of the SARADC.

FIG. 4 is a circuit diagram showing a specific example configuration (100A) of the SARADC 100. The SARADC 100A receives differential inputs INP and INN, and generates 16-bit digital data AD16DAT[15:0]. First, description will be made regarding a configuration of the analog block 102 side.

The capacitance array D/A converter 110 receives the differential inputs INP and INN. Furthermore, the capacitance array D/A converter 110 receives inputs of the reference voltage VREF50 (e.g., 5 V), VREF0 (e.g., 0 V), and VCM (e.g., 2.5 V, which is the midpoint voltage between them). The capacitive array D/A converter 110 samples the input voltages INP and INN according to the timing signal vins.

Furthermore, in the k-th cycle, the capacitive array D/A converter 110 generates differential threshold voltages VTHPk and VTHNk that correspond to the control signal ctrlk using the reference voltages VREF50 and VREF0.

The capacitive array D/A converter 110 outputs signals daoutp and daoutn that correspond to the differential inputs INP and INN and the differential threshold voltages VTHP and VTHN. For example, the following Expressions hold true.

$$daoutp = A \times (INP - VTHPk)$$
$$daoutn = A \times (INN - VTHNk)$$

Here, A represents the gain.

The comparison circuit 120 receives the outputs daoutp and daoutn of the capacitive array D/A converter 110 and compares them according to the comparison clock cmpclk. The comparison clock cmpclk is supplied from the logic circuit 140.

When daoutp<daoutn, the comparison signal comp that is an output of the comparison circuit 120 is high (H). Conversely, when daoutp>daoutn, the comparison signal comp is low (L). That is to say, the comparison signal comp represents the comparison result between the signal component of the differential input (INP–INN) and the signal component of the reference voltage (VTHP–VTHN).

The comparison circuit 120 includes a comparator 122 and a first delay circuit 124. The first delay circuit 124 delays the comparison clock cmpclk so as to generate a latch clock latchclk.

The comparator 122 compares the outputs daoutp and daoutn of the comparison circuit 120 according to the latch clock latchclk.

In the present embodiment, the comparator 122 includes differential outputs compop and compon. The differential output compop, which is one of the differential outputs, is employed as the comparison signal comp. For example, when the latch clock latch latchclk is set to a first level (e.g., H), both the differential outputs compop and compon of the comparator 122 become H. Furthermore, when the latch clock latchclk is set to the second level (e.g., L), one of the differential outputs compop and compon becomes H according to the magnitude relation between them, and the other becomes L.

The clock generating circuit 130 receives the outputs compop and compon of the comparison circuit 120 and generates the successive approximation clock sarclk. The clock generating circuit 130 includes a logic gate 132 and a second delay circuit 134. The logic gate 132 is configured as a NAND gate that receives the two outputs compop and compon of the comparator 122. The logic gate 132 outputs one pulse each time the comparison circuit 120 operates once. The second delay circuit 134 delays the output of the logic gate 132, and outputs this as the successive approximation clock sarclk to the logic circuit 140.

With such an arrangement provided with the second delay circuit 134, this is capable of adjusting the operation timing of the logic circuit 140. Specifically, this makes it possible to secure a setup margin for the comparison data.

The logic gate 132 configured as a NAND gate has an inverting input. The timing signal vins generated by the logic circuit 140 is input to the inverting input as a seed pulse SP. When the timing signal vins is injected into the delay loop 144 as the seed pulse SP, the operation of the ring oscillator starts.

Next, description will be made regarding the configuration of the digital block 104 side.

The logic circuit 140 includes a SAR processing unit 160, a clock processing unit 162, a timing processing unit 164, and an abnormal state detection circuit 200.

The processing supported by the logic circuit 140 with respect to the clock signals is integrated in the clock processing unit 162. The external clock AD16CLK is input to the clock processing unit 162. The clock processing unit 162 buffers the external clock AD16CLK and supplies the external clock AD16CLK to the timing processing unit 164 as the timing clock TIMCLK. The timing processing unit 164 operates in synchronization with the timing clock TIMCLK. Furthermore, the successive approximation clock sarclk received from the analog block 102 is output to the analog block 102 as the comparison clock cmpclk via the clock processing unit 162. Moreover, the successive approximation clock sarclk is input to the SAR processing unit 160 as the successive approximation clock SARCLK.

The SAR processing unit 160 operates in synchronization with the successive approximation clock SARCLK. The SAR processing unit 160 determines the current bit value SAR_Data according to the comparison signal comp from the comparison circuit 120 in the k-th cycle. Furthermore, the SAR processing unit 160 determines the threshold voltage VTH(k+1) in the next cycle (k+1) via a binary search, and outputs the control signal ctrl.

The timing processing unit 164 performs timing control in the logic circuit 140 and the analog block 102. Specifically, the timing processing unit 164 outputs the signals AD16DAT[15:0], AD16FLG, and AD16CNVFAIL generated by the analog block 102 or the digital block 104 in synchronization with the external clock AD16CLK. Furthermore, the timing processing unit 164 acquires the start signal AD16CNV to be input from an external circuit in synchronization with the external clock AD16CLK. The timing processing unit 164 generates various kinds of timing signals (e.g., vins) in synchronization with the external clock AD16CLK.

A sample period cycle setting signal AD16VINSL[4:0] is input to the timing processing unit 164. The length of the period (number of cycles of the external clock AD16CLK) of the timing signal vins is set according to the setting signal AD16VINSL[4:0].

As described above, the abnormal state detection circuit 200 executes time-related processing such as counting the number of cycles of the external clock AD16CLK. Accordingly, the abnormal state detection circuit 200 can be implemented as a part of the timing processing unit 164. Also, the abnormal state detection circuit 200 can be implemented as a hardware component shared with the timing processing unit 164.

In addition to the sample period cycle setting signal AD16VINSL[4:0], a successive approximation period cycle setting signal AD16SARL[4:0] is input to the timing processing unit 164. The setting signals AD16SARL[4:0] and AD16VINSL[4:0] define the first number of cycles CYC1 that defines the time limit.

Figure 5:
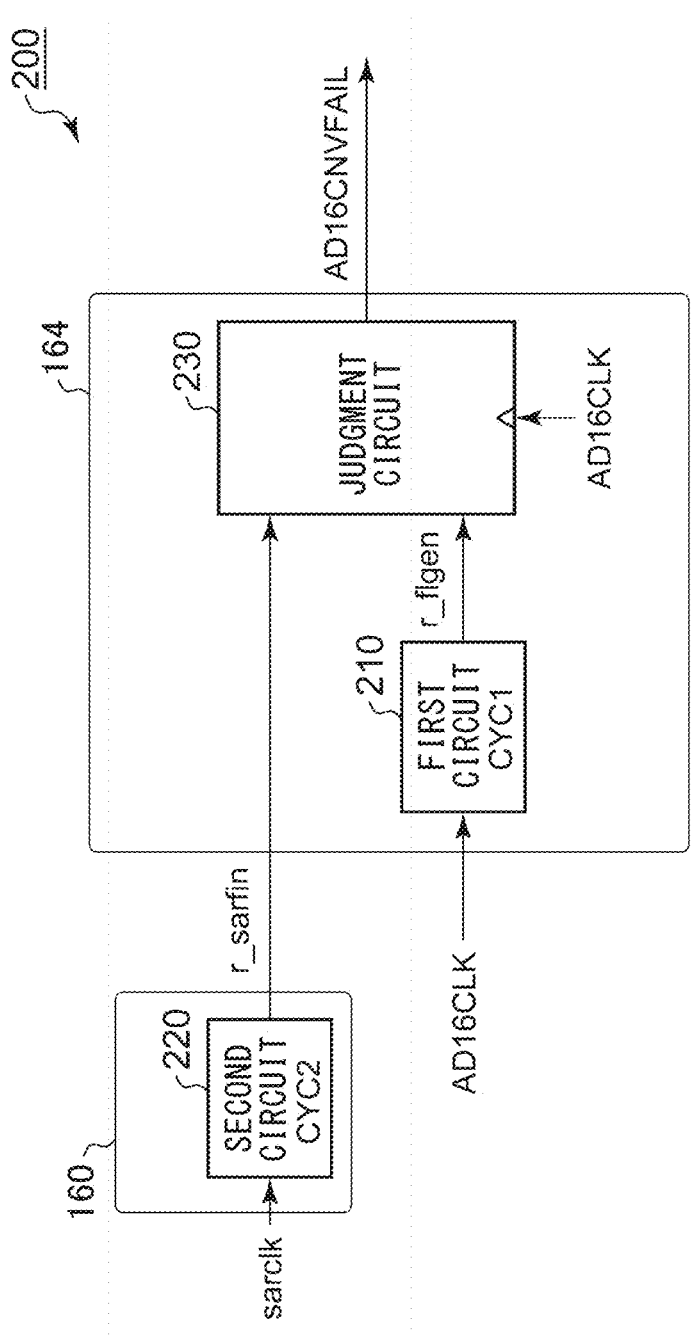
FIG. 5 is a circuit diagram showing an example configuration of an abnormal state detection circuit.

FIG. 5 is a circuit diagram showing an example configuration of the abnormal state detection circuit 200. The abnormal state detection circuit 200 includes a first circuit 210, a second circuit 220, and a judgment circuit 230. After the assertion of the start signal AD16CNV for indicating the start of the conversion operation of the SARADC 100A, the first circuit 210 asserts a first timing signal r_flgen after the generation of the first number of cycles CYC1 of the external clock AD16CLK. The first timing signal r_flgen indicates the time limit.

After the assertion of the start signal AD16CNV, the second circuit 220 asserts a second timing signal r_sarfin after the generation of the second number of cycles CYC2 of the successive approximation clock sarclk.

The judgment circuit 230 generates the fail signal AD16CNVFAIL for indicating the presence or absence of an abnormal state based on the first timing signal r_flgen and the second timing signal r_sarfin. Specifically, when the assertion of the second timing signal r_sarfin is earlier than the assertion of the first timing signal r_flgen, the operation is judged to be normal, and the fail signal AD16CNVFAIL is negated. Conversely, when the assertion of the first timing signal r_flgen is earlier than the assertion of the second timing signal r_sarfin, the fail signal AD16CNVFAIL is asserted.

For example, the first circuit 210 and the judgment circuit 230 can be configured as a part of the timing processing unit 164. Also, the second circuit 220 can be configured as a part of the SAR processing unit 160.

Figure 6:
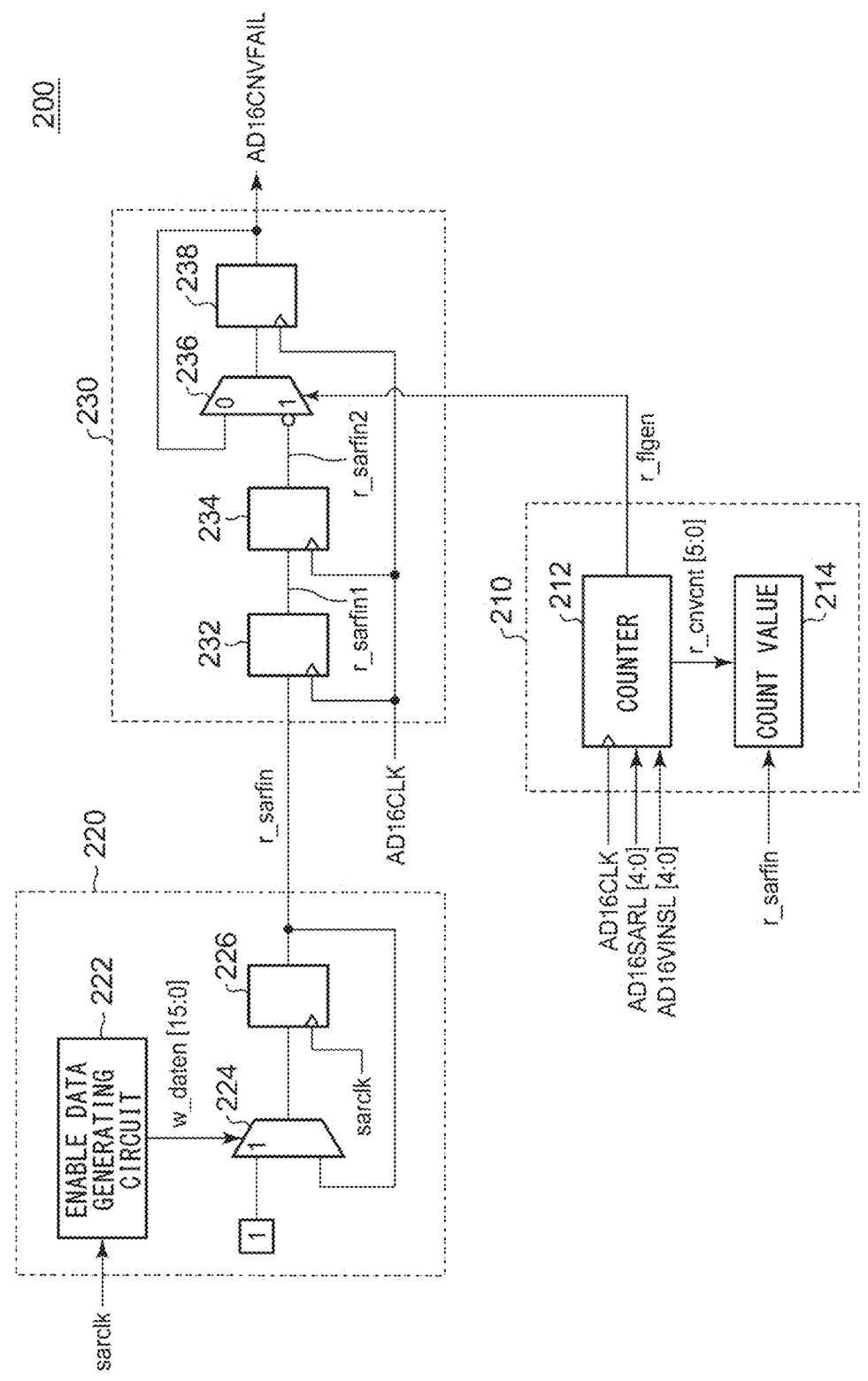
FIG. 6 is a circuit diagram showing a specific example configuration of the abnormal state detection circuit.

FIG. 6 is a circuit diagram showing a specific example configuration of the abnormal state detection circuit 200. The first circuit 210 includes a counter 212. The counter 212 performs a counting operation in synchronization with the external clock AD16CLK. After the generation of the first number of cycles CYC1 of the external clock AD16CLK, the counter 212 asserts the first timing signal r_flgen.

The operation of the counter 212 is set by the successive approximation period cycle setting signal AD16SARL[4:0] and the sample period cycle setting signal AD16VINSL[4:0]. The sum of the successive approximation period cycle setting signal AD16SARL[4:0] and the sample period cycle setting signal AD16VINSL[4:0] is employed as the initial value of the counter 212, for example, "14h". The counter 212 is configured as a down counter configured to count down with each cycle of the external clock AD16CLK. When the count value r_cnvent[5:0] reaches a predetermined value (e.g., "03h"), the first timing signal r_flgen is asserted.

The first circuit 210 includes memory (a register) 214 that holds the count value of the counter 212 when the second timing signal r_sarfin is asserted. The memory 214 may be configured so as to be readable from a tester when the SARADC 100A is tested. Also, the memory 214 may be configured to be readable from an external microcontroller in a state in which the SARADC 100A is mounted on an electronic device.

The count value can be used for optimizing parameters or debugging in the design stage. Also, in actual operation, by referring to the count value by means of the microcontroller configured to control the A/D converter, this is capable of monitoring the stability of the circuit operation or the like.

The second circuit 220 includes an enable data generating circuit 222, a selector 224, and a flip-flop 226. The enable data generating circuit 222 generates enable data w_daten [15:0]. The enable data w_daten[15:0] has the same number of bits as that of the SARADC 100A, and indicates the position of the bit that is currently being processed. That is to say, initially, the most significant bit of the enable data w_daten[15:0] is "1", and the other bits thereof are each "0". The position of the bit with the value "1" is shifted toward the least significant bit according to the progress of the successive approximation. Eventually, after all the bits are "0", the processing ends. That is to say, when the value of the enable data w_daten[15:0] is represented as a hexadecimal number, initially, the enable data w_daten[15:0] is "8000h", then switches to "4000h" and "2000h", and eventually becomes "0001h" and "0000h".

The selector 224 receives the value "1" and the output of the flip-flop 226. The initial value of the flip-flop 226 is set to "0". When the value of the enable data w_daten[15:0] is not "0001h", the selector 224 selects the output of the flip-flop 226. When the value of the enable data w_daten [15:0] is "0001h", the selector 224 selects the value "1".

When the next successive approximation clock sarclk is input to the flip-flop 226 in a state in which the value of enable data w_daten[15:0] is "0001h", the value of the flip-flop 226 switches from "0" to "1", thereby asserting the second timing signal r_sarfin. This indicates the timing at which the processing is completed for all the bits.

The judgment circuit 230 includes flip-flops 232 and 234, a selector 236, and a flip-flop 238. The first timing signal r_flgen generated by the first circuit 210 and the second timing signal r_sarfin generated by the second circuit 220 are input to the judgment circuit 230.

The second timing signal r_sarfin is asynchronous to the external clock AD16CLK. The two stages of the flip-flops 232 and 234 adjust the second timing signal r_sarfin so as to be synchronous with the external clock AD16CLK. The output r_sarfin2 of the flip-flop 234 is input to the selector 236.

The selector 236 receives the inverted output of the flip-flop 234 and the output of the flip-flop 238. The initial value of the flip-flop 238 is set to zero. During a period in which the first timing signal r_flgen is negated (0), the selector 236 selects the output of the flip-flop 238. When the first timing signal r_flgen is asserted (1), the selector 236 selects the inverted signal of the output of the flip-flop 234, i.e., r_sarfin2.

When the second timing signal r_sarfin is asserted at the timing at which the first timing signal r_flgen is asserted, the fail signal AD16CNVFAIL, which is the output of the flip-flop 238, remains low (negated). When the second timing signal r_sarfin is negated at the timing at which the first timing signal r_flgen is asserted, the fail signal AD16CNVFAIL, which is the output of the flip-flop 238, is asserted (high).

The above is the configuration of the SARADC 100A and the abnormal state detection circuit 200.

Figure 7:
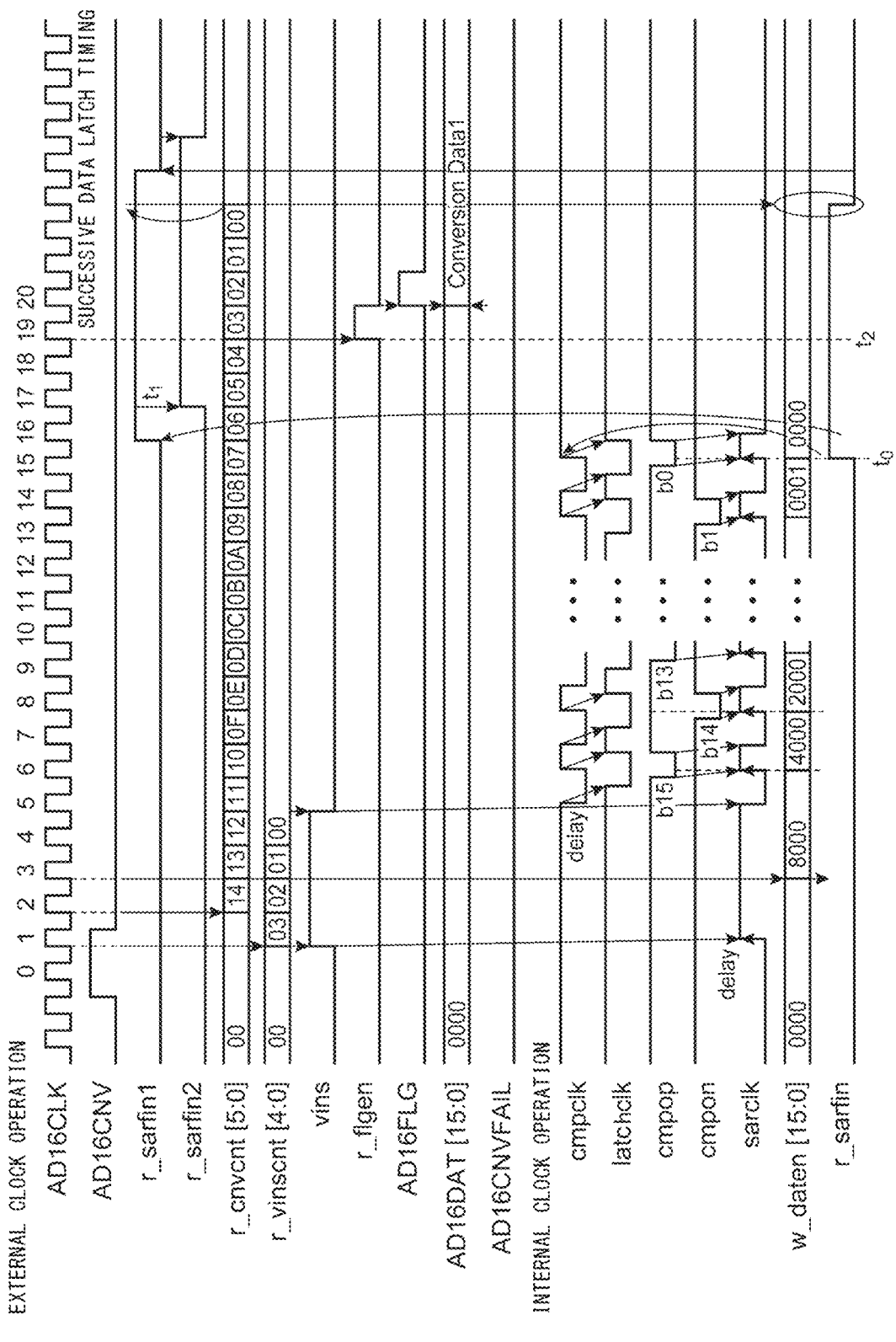
FIG. 7 is a time chart for explaining the operation of the SARADC shown in FIG. 4 when it is normal.

FIG. 7 is a time chart for explaining the operation of the SARADC 100A shown in FIG. 4 when it is normal. Here, r_vinscnt[4:0] represents the count value of a counter that defines the sample period of the input signal (pulse width of the timing signal vins). During a period in which the counter counts down, the timing signal vins is set to the high level. The timing signal vins functions as a seed pulse, and accordingly, the delay loop 144 starts to oscillate. This activates the successive approximation clock sarclk and the comparison clock cmpclk.

The value of the enable data w_daten[15:0] (hexadecimal value) is reduced according to the successive approximation clock sarclk. When the enable data w_daten[15:0] value becomes "0000h" at the time point $t_0$, the second timing signal r_sarfin is asserted. After the synchronization by the external clock AD16CLK, the timing signal r_sarfin2 is asserted at the time point $t_1$. Furthermore, at the time point $t_2$, i.e., at the 19-th cycle after the assertion of the start signal AD16CNV, the first timing signal r_flgen is asserted.

In this case, the relation $t_1 < t_2$ holds true. Accordingly, the fail signal AD16CNVFAIL is negated. At the time point $t_3$, i.e., at the 20-th cycle, after the assertion of the start signal AD16CNV, the end signal AD16FLG is asserted. With the end signal AD16FLG as a trigger, the value of the output data AD16DAT[15:0] is determined.

Figure 8:
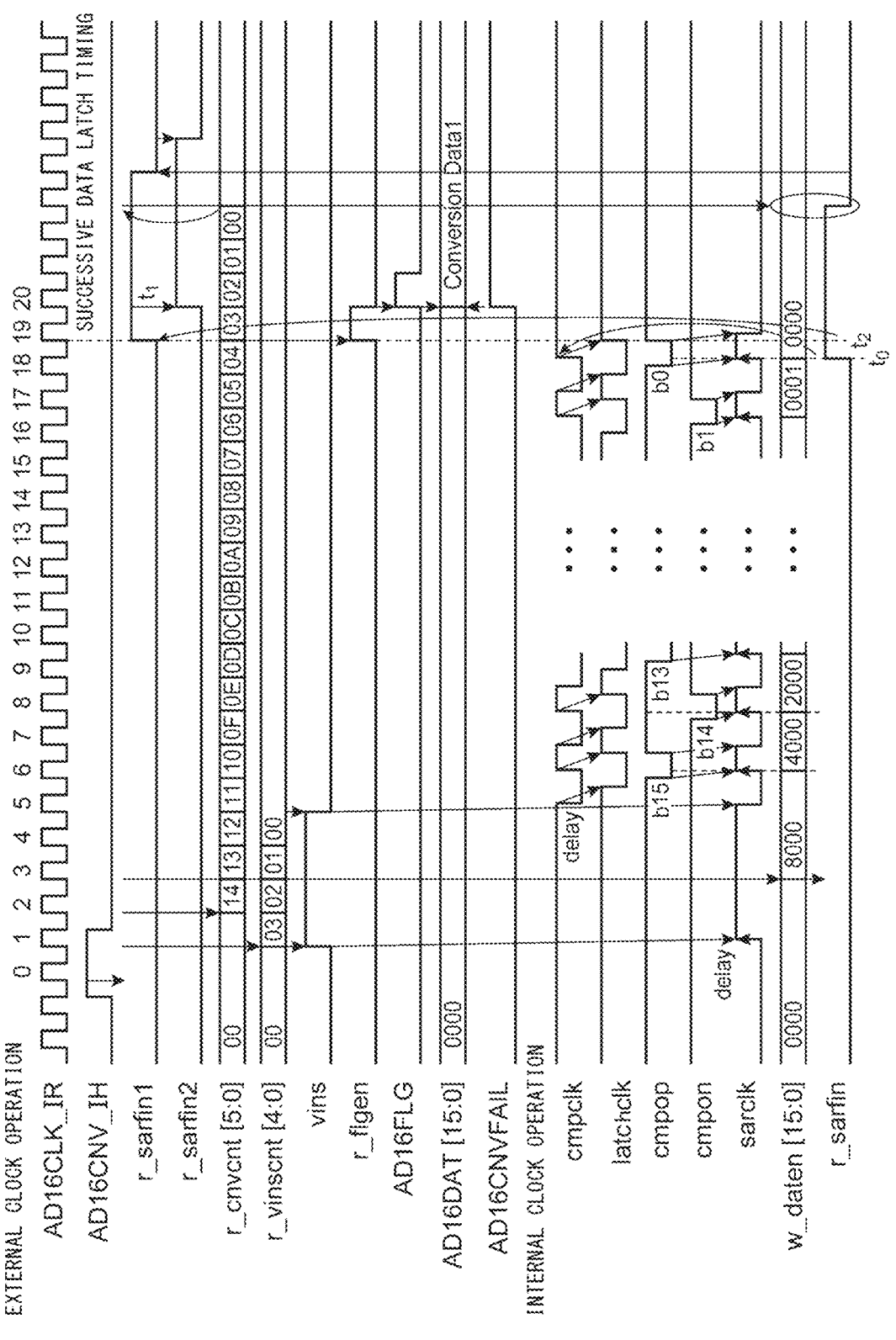
FIG. 8 is a time chart for explaining the operation of the SARADC shown in FIG. 4 when it is abnormal.

FIG. 8 is a time chart for explaining the operation of the SARADC 100A shown in FIG. 4 when an abnormal state has occurred. When the value of the enable data w_daten [15:0] (hexadecimal value) becomes "0000h" at the time point to, the second timing signal r_sarfin is asserted. After the synchronization by the external clock AD16CLK, the timing signal r_sarfin2 is asserted at the time point $t_1$. The time point $t_1$ is later than the time point $t_2$ at which the first timing signal r_flgen is asserted at the 19-th cycle. As a result, the fail signal AD16CNVFAIL is asserted.

The above is the operation of the SARADC 100A and the abnormal state detection circuit 200. With the abnormal state detection circuit 200, this allows an abnormal state in the SARADC 100A to be detected.

The above-described embodiments have been described for exemplary purposes only. Rather, it can be readily conceived by those skilled in this art that various modifications may be made by making various combinations of the aforementioned components or processes. Description will be made below regarding such modifications.

Modification 1

Figure 9:
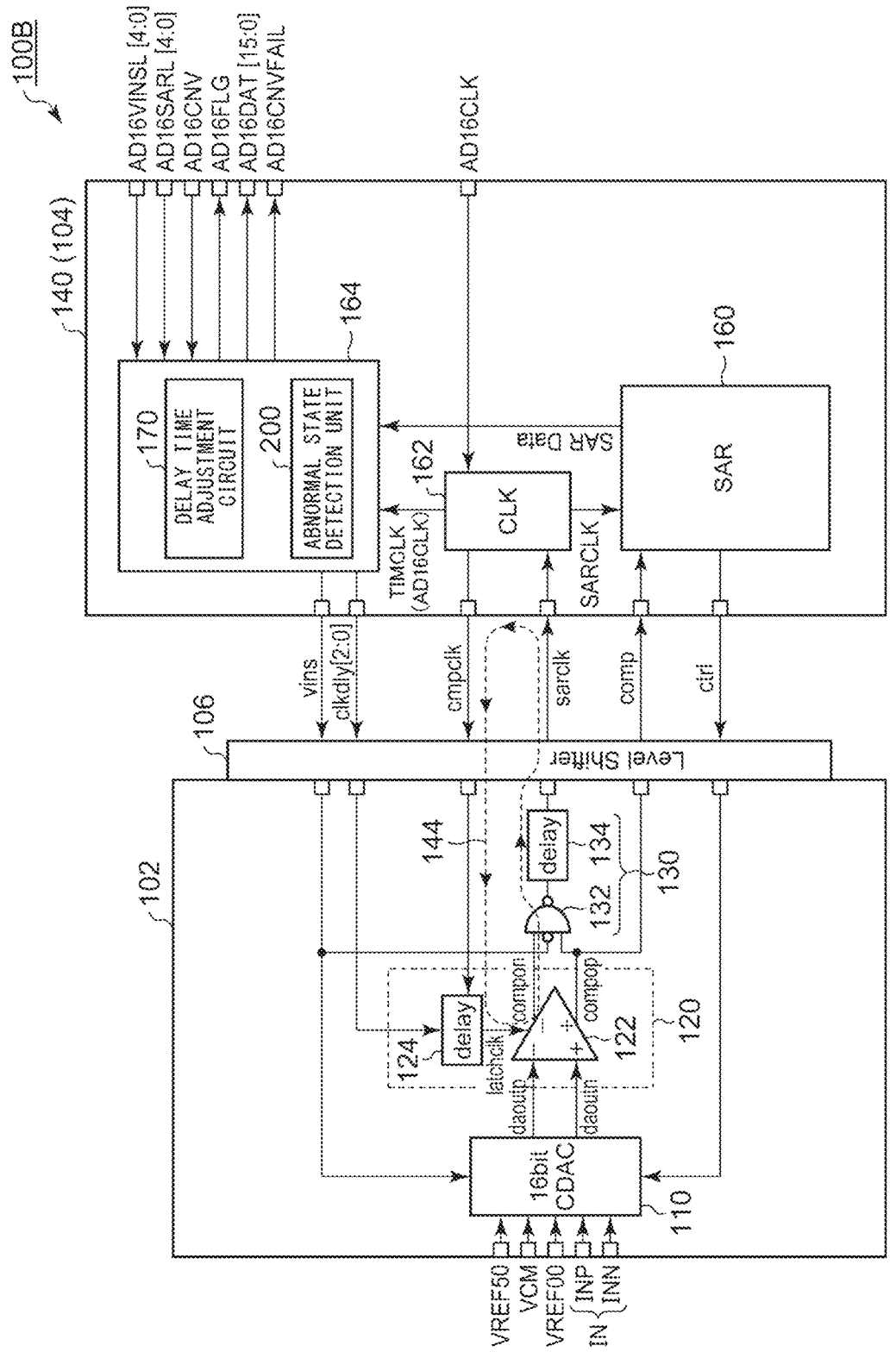
FIG. 9 is a circuit diagram of a SARADC according to a modification.

FIG. 9 is a circuit diagram of a SARADC 100B according to a modification 1. In the SARADC 100B, the first delay circuit 124 is configured as a variable delay circuit. The delay amount of the first delay circuit 124 can be set according to the delay time setting signal clkdly[2:0] from the logic circuit 140. By adjusting the delay time of the first delay circuit 124, this is capable of adjusting the round trip time of the delay loop 144, i.e., the frequencies of the self-running clocks cmpclk and sarclk.

In this modification, the logic circuit 140B includes a delay time adjustment circuit 170 in addition to the logic circuit 140 shown in FIG. 4. In the calibration mode, the delay time adjustment circuit 170 is activated. The delay time adjustment circuit 170 automatically adjusts the delay setting signal clkdly[2:0], i.e., the delay time of the first delay circuit 124 such that the fail signal AD16CNVFAIL is not asserted.

For example, in the calibration mode, the delay time adjustment circuit 170 sweeps the delay setting signal clkdly [2:0] so as to monitor the fail signal AD16CNVFAIL for each value. With this, the delay time adjustment circuit 170 may select the delay setting signal clkdly[2:0] such that the fail signal AD16CNVFAIL is not asserted.

Also, the delay time adjustment circuit 170 may determine the value of the delay setting signal clkdly[2:0] based on the count value stored in the memory 214 shown in FIG. 6.

Modification 2

The delay time setting signal clkdly[2:0] may be configured to be settable from outside the SARADC 100B.

The embodiments have been described for exemplary purposes only. Rather, it can be readily conceived by those skilled in this art that various modifications may be made by making various combinations of the aforementioned components or processes, which are also encompassed in the present disclosure or the technical scope of the present disclosure.

Notes

The following techniques are disclosed in the present specification.

Item 1

A successive approximation register A/D converter comprising:
   a capacitive array D/A converter structured to sample an input voltage, to convert control data into a threshold voltage, and to output a signal that corresponds to the input voltage and the threshold voltage;
   a comparison circuit structured to receive an output of the capacitive array D/A converter, and to perform comparison processing according to a comparison clock;
   a clock generating circuit structured to generate a successive approximation clock based on an output of the comparison circuit; and
   a logic circuit structured to receive a comparison signal that indicates a comparison result of the comparison circuit and the successive approximation clock, to update the control data, and to supply the comparison clock based on the successive approximation clock to the comparison circuit,
   wherein the logic circuit is structured to count the successive approximation clock and an external clock after a start of A/D conversion, to judge that operation is normal when a predetermined second number of cycles of the successive approximation clock is detected before detection of a predetermined first number of cycles of the external clock, and to judge that an abnormal state has occurred when the predetermined second number of cycles of the successive approximation clock have not been detected at a time point at which the first number of cycles of the external clock have been detected.

Item 2

The successive approximation register A/D converter according to item 1, wherein the logic circuit comprises:
   a first circuit structured to count the external clock after an assertion of a start signal that indicates the start of A/D conversion of the A/D converter, and to assert a first timing signal in response to detection of the first number of cycles of the external clock;
   a second circuit structured to count the successive approximation clock after the assertion of the start signal and to assert a second timing signal in response to detection of the second number of cycles of the successive approximation clock; and a judgment circuit structured to generate a fail signal that indicates the presence or absence of an abnormal state based on the first timing signal and the second timing signal.

Item 3

The successive approximation register A/D converter according to item 2, wherein the first circuit comprises a counter structured to operate in synchronization with the external clock, and to output a count value of the counter when the second timing signal is asserted.

Item 4

The successive approximation register A/D converter according to item 2 or 3, wherein the second circuit comprises an enable data generating circuit structured to generate enable data having the same number of bits as that of output data of the successive approximation register A/D converter having a bit with a value of "1" that shifts from the most significant bit to the least significant bit for each cycle of the successive approximation clock, and wherein the second circuit is structured to assert the second timing signal when the next successive approximation clock is generated in a state in which the least significant bit of the enable data is "1".

Item 5

The successive approximation register A/D converter according to any one of items 1 through 4, wherein the comparison circuit comprises:
a first delay circuit structured to delay the comparison clock; and
a comparator structured to compare an output of the capacitive array D/A converter according to a latch clock delayed by the first delay circuit.

Item 6

The successive approximation register A/D converter according to item 5, wherein the first delay circuit is configured as a variable delay circuit.

Item 7

The successive approximation register A/D converter according to item 6, wherein the first delay circuit provides a delay time that is settable from an exterior.

Item 8

The successive approximation register A/D converter according to item 6, further comprising a delay time adjustment circuit structured to automatically adjust the delay time of the first delay circuit.

Item 9

The successive approximation register A/D converter according to any one of items 5 through 8, wherein the comparator is structured as a differential comparator having two outputs,
wherein, when the latch clock is a first level, the two outputs of the comparator become high,

wherein, when the latch clock is a second level, one from among the two outputs of the comparator becomes low according to a comparison result,
and wherein the clock generating circuit comprises a NAND gate structured to receive the two outputs of the comparator.

Item 10

The successive approximation register A/D converter according to any one of items 1 through 9, wherein the logic circuit generates a seed pulse in synchronization with the external clock after a start of A/D conversion,
and wherein the seed pulse is input to the clock generating circuit.

Item 11

The successive approximation register A/D converter according to any one of items 1 through 10 further comprises a second delay circuit structured to delay an output of the clock generating circuit so as to generate the successive approximation clock.

Item 12

The successive approximation register A/D converter according to any one of items 1 through 11, monolithically integrated on a single semiconductor substrate.

What is claimed is:
1. A successive approximation register A/D converter comprising:
a capacitive array D/A converter structured to sample an input voltage, to convert control data into a threshold voltage, and to output a signal that corresponds to the input voltage and the threshold voltage;
a comparison circuit structured to receive an output of the capacitive array D/A converter, and to perform comparison processing according to a comparison clock;
a clock generating circuit structured to generate a successive approximation clock based on an output of the comparison circuit; and
a logic circuit structured to receive a comparison signal that indicates a comparison result of the comparison circuit and the successive approximation clock, to update the control data, and to supply the comparison clock based on the successive approximation clock to the comparison circuit,
wherein the logic circuit is structured to count the successive approximation clock and an external clock after a start of A/D conversion, to judge that operation is normal when a predetermined second number of cycles of the successive approximation clock is detected before detection of a predetermined first number of cycles of the external clock, and to judge that an abnormal state has occurred when the predetermined second number of cycles of the successive approximation clock have not been detected at a time point at which the first number of cycles of the external clock have been detected,
wherein the logic circuit comprises:
a first circuit structured to count the external clock after an assertion of a start signal that indicates the start of A/D conversion of the A/D converter, and to assert a first timing signal in response to detection of the first number of cycles of the external clock;

a second circuit structured to count the successive approximation clock after the assertion of the start signal and to assert a second timing signal in response to detection of the second number of cycles of the successive approximation clock; and a judgment circuit structured to generate a fail signal that indicates the presence or absence of an abnormal state based on the first timing signal and the second timing signal.

2. The successive approximation register A/D converter according to claim 1, wherein the first circuit comprises a counter structured to operate in synchronization with the external clock and to output a count value of the counter when the second timing signal is asserted.

3. The successive approximation register A/D converter according to claim 1, wherein the second circuit comprises an enable data generating circuit structured to generate enable data having the same number of bits as that of output data of the successive approximation register A/D converter having a bit with a value of "1" that shifts from the most significant bit to the least significant bit for each cycle of the successive approximation clock, and wherein the second circuit is structured to assert the second timing signal when the next successive approximation clock is generated in a state in which the least significant bit of the enable data is "1".

4. A successive approximation register A/D converter comprising:

a capacitive array D/A converter structured to sample an input voltage, to convert control data into a threshold voltage, and to output a signal that corresponds to the input voltage and the threshold voltage;

a comparison circuit structured to receive an output of the capacitive array D/A converter, and to perform comparison processing according to a comparison clock;

a clock generating circuit structured to generate a successive approximation clock based on an output of the comparison circuit; and a logic circuit structured to receive a comparison signal that indicates a comparison result of the comparison circuit and the successive approximation clock, to update the control data, and to supply the comparison clock based on the successive approximation clock to the comparison circuit, wherein the logic circuit is structured to count the successive approximation clock and an external clock after a start of A/D conversion, to judge that operation is normal when a predetermined second number of cycles of the successive approximation clock is detected before detection of a predetermined first number of cycles of the external clock, and to judge that an abnormal state has occurred when the predetermined second number of cycles of the successive approximation clock have not been detected at a time point at which the first number of cycles of the external clock have been detected, wherein the comparison circuit comprises:

a first delay circuit structured to delay the comparison clock; and a comparator structured to compare an output of the capacitive array D/A converter according to a latch clock delayed by the first delay circuit.

5. The successive approximation register A/D converter according to claim 4, wherein the first delay circuit is configured as a variable delay circuit.

6. The successive approximation register A/D converter according to claim 5, wherein the first delay circuit provides a delay time that is settable from an exterior.

7. The successive approximation register A/D converter according to claim 5, further comprising a delay time adjustment circuit structured to automatically adjust the delay time of the first delay circuit.

8. The successive approximation register A/D converter according to claim 4, wherein the comparator is structured as a differential comparator having two outputs, wherein, when the latch clock is a first level, the two outputs of the comparator become high, wherein, when the latch clock is a second level, one from among the two outputs of the comparator becomes low according to a comparison result, and wherein the clock generating circuit comprises a NAND gate structured to receive the two outputs of the comparator.

9. The successive approximation register A/D converter according to claim 1, wherein the logic circuit generates a seed pulse in synchronization with the external clock after a start of A/D conversion, and wherein the seed pulse is input to the clock generating circuit.

10. The successive approximation register A/D converter according to claim 1, further comprising a delay circuit structured to delay an output of the clock generating circuit so as to generate the successive approximation clock.

11. The successive approximation register A/D converter according to claim 1, monolithically integrated on a single semiconductor substrate.

12. The successive approximation register A/D converter according to claim 4, wherein the logic circuit generates a seed pulse in synchronization with the external clock after a start of A/D conversion, and wherein the seed pulse is input to the clock generating circuit.

13. The successive approximation register A/D converter according to claim 4, further comprising a second delay circuit structured to delay an output of the clock generating circuit so as to generate the successive approximation clock.

14. The successive approximation register A/D converter according to claim 4, monolithically integrated on a single semiconductor substrate.

* * * * *